(12) United States Patent
Notohardjono et al.

(10) Patent No.: US 11,070,037 B2
(45) Date of Patent: Jul. 20, 2021

(54) MULTI-DIRECTIONAL IMPACT PROTECTION WITH MAGNITUDE AND DIRECTION INDICATOR

(71) Applicant: INTERNATIONAL BUSINESS MACHINES CORPORATION, Armonk, NY (US)

(72) Inventors: Budy Notohardjono, Poughkeepsie, NY (US); Suraush Khambati, Poughkeepsie, NY (US); Shawn Canfield, Poughkeepsie, NY (US); Richard M. Ecker, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/158,827

(22) Filed: Oct. 12, 2018

(65) Prior Publication Data
US 2020/0119531 A1    Apr. 16, 2020

(51) Int. Cl.
*A47B 95/04*    (2006.01)
*H02B 1/30*    (2006.01)
(Continued)

(52) U.S. Cl.
CPC ........... *H02B 1/306* (2013.01); *A47B 95/043* (2013.01); *H02B 1/303* (2013.01); *H02B 1/54* (2013.01); *H02B 1/32* (2013.01)

(58) Field of Classification Search
CPC .. B65D 81/053; B65D 81/054; A47B 95/043; A47B 2095/046; F16F 1/3732;
(Continued)

(56) References Cited

U.S. PATENT DOCUMENTS 2,160,221 A * 5/1939 Masters ............... B65D 5/5033
                                                             206/586
2,266,181 A * 12/1941 Epps ...................... B65D 71/04
                                                             206/544
(Continued)

FOREIGN PATENT DOCUMENTS

EP          0921924 B1    6/2002
JP         H06163758 A    6/1994

OTHER PUBLICATIONS

"Standard Impact Attenuator Design", https://www.fsaeonline.com/page.aspx?pageid=193613e4-fff1-4ea9-97ec . . . , printed Jun. 15, 2018, pp. 1-3.
(Continued)

*Primary Examiner* — Jonathan Liu
*Assistant Examiner* — Guang H Guan
(74) *Attorney, Agent, or Firm* — Tihon Poltavets

(57) ABSTRACT

An apparatus for protecting against a multi-directional impact, includes a body with a first set of radial segments, where the body is coupled to an object such that the first set of radial segments extend beyond a planar surface of the object. The apparatus further includes a first radial segment of the first set of radial segments having a diameter greater than a second radial segment of the first set of radial segments. The apparatus further includes a first notch of the first set of radial segments separating the first radial segment and the second radial segment having a concave edge, wherein the first radial segment and the second radial segment each extend beyond the concave edge of the first notch of the first set of radial segments.

10 Claims, 10 Drawing Sheets

(51) Int. Cl.
*H02B 1/54* (2006.01)
*H02B 1/32* (2006.01)

(58) Field of Classification Search
CPC ........ F16F 1/3735; F16F 1/426; H02B 1/303;
H02B 1/306; H02B 1/32; H02B 1/34;
H02B 1/36; H02B 1/54
USPC ................ 248/345.1; 206/453, 586; D8/403
See application file for complete search history.

(56) References Cited

U.S. PATENT DOCUMENTS

| | | | | |
|---|---|---|---|---|
| 3,030,728 A * | 4/1962 | Wesman | ............... | A47B 95/043 |
| | | | | 248/345.1 |
| 3,047,142 A * | 7/1962 | Heffley | ................ | A47B 95/043 |
| | | | | 206/453 |
| 3,049,260 A * | 8/1962 | Stone | ................... | B65D 81/054 |
| | | | | 217/53 |
| 3,869,106 A * | 3/1975 | Gregov | ............... | A47B 95/043 |
| | | | | 248/345.1 |
| 3,938,841 A * | 2/1976 | Glance | ................... | B60R 19/18 |
| | | | | 293/120 |
| 4,113,110 A * | 9/1978 | Mittag | ................. | A47B 95/043 |
| | | | | 211/183 |
| 4,120,441 A * | 10/1978 | Hurley | ................. | B65D 5/5088 |
| | | | | 206/453 |
| 4,235,427 A * | 11/1980 | Bialobrzeski | ........... | F16F 1/424 |
| | | | | 267/153 |
| 4,898,285 A * | 2/1990 | Field | .................... | A47B 95/043 |
| | | | | 211/183 |
| 4,920,907 A * | 5/1990 | Richter | ..................... | E02B 3/26 |
| | | | | 114/219 |
| 4,964,760 A * | 10/1990 | Hartman | ................... | E02B 3/26 |
| | | | | 405/215 |
| 5,297,682 A | 3/1994 | Miltenberger | | |
| 5,335,770 A | 8/1994 | Baker et al. | | |
| 5,385,236 A * | 1/1995 | Cowan | .................. | B65D 71/04 |
| | | | | 206/453 |
| 5,527,097 A * | 6/1996 | Martin | ................. | A47B 95/043 |
| | | | | 297/463.1 |
| 5,639,072 A * | 6/1997 | McCall | ............... | A47B 95/043 |
| | | | | 248/345.1 |
| 5,681,057 A | 10/1997 | Whirley et al. | | |
| 6,019,336 A * | 2/2000 | Havens | ................ | A47B 95/043 |
| | | | | 248/205.3 |
| 6,062,632 A | 5/2000 | Brachos et al. | | |
| 6,242,070 B1 * | 6/2001 | Gillispie | ............... | E01F 15/141 |
| | | | | 428/122 |
| 6,289,836 B1 * | 9/2001 | Tellex | ...................... | E02B 3/26 |
| | | | | 114/219 |
| 6,314,688 B1 * | 11/2001 | Ford | ..................... | A62B 99/00 |
| | | | | 52/101 |
| 6,477,973 B1 * | 11/2002 | Kobas | ..................... | B63B 59/02 |
| | | | | 114/219 |
| 6,682,037 B1 * | 1/2004 | Ouellette | ............. | A47B 95/043 |
| | | | | 248/206.3 |
| 6,802,307 B2 * | 10/2004 | Leven | .................. | F41B 5/1426 |
| | | | | 124/89 |
| 6,808,207 B2 * | 10/2004 | Nakano | ............... | B60R 22/1952 |
| | | | | 277/634 |
| 6,840,372 B2 * | 1/2005 | Giles | .................... | B65D 81/056 |
| | | | | 206/216 |
| 7,405,926 B2 * | 7/2008 | Wu | ....................... | H05K 7/1494 |
| | | | | 211/26 |
| 7,566,877 B2 | 7/2009 | Bhatt | | |
| 7,575,391 B2 * | 8/2009 | Tarazona de La Asuncion | .......... | |
| | | | | E01F 15/0461 |
| | | | | 188/371 |
| 7,950,706 B2 * | 5/2011 | Shaw | ...................... | B65G 1/02 |
| | | | | 293/142 |
| D653,104 S * | 1/2012 | Heyting | ........................ | D8/403 |
| 8,267,262 B2 * | 9/2012 | Thelwell | ............... | E01F 15/141 |
| | | | | 211/183 |
| 8,567,881 B2 * | 10/2013 | Hsiao | ................... | H05K 7/1497 |
| | | | | 312/223.1 |
| 8,615,950 B1 * | 12/2013 | Gomes | .................... | E04F 13/04 |
| | | | | 52/255 |
| 8,783,476 B2 * | 7/2014 | Woodley | ............... | A47B 13/083 |
| | | | | 211/183 |
| 8,875,889 B2 | 11/2014 | Smith | | |
| 8,919,750 B2 | 12/2014 | Pearce et al. | | |
| 9,434,524 B2 * | 9/2016 | Kindig | ................... | B65D 81/053 |
| 9,629,232 B2 | 4/2017 | Reilly et al. | | |
| 9,732,485 B2 * | 8/2017 | McCue | .................. | E01F 15/141 |
| 9,752,291 B2 * | 9/2017 | Michael | ............... | E01F 15/141 |
| 9,928,928 B2 | 3/2018 | Collin et al. | | |
| 2001/0047975 A1 * | 12/2001 | Lazas | ..................... | E04F 19/028 |
| | | | | 211/183 |
| 2003/0217948 A1 | 11/2003 | Lantz | | |
| 2006/0169906 A1 | 8/2006 | Bhatt | | |
| 2008/0106107 A1 | 5/2008 | Tan et al. | | |
| 2012/0103864 A1 | 5/2012 | Grenchus, Jr. et al. | | |
| 2016/0320149 A1 | 11/2016 | Poltorak | | |
| 2020/0119531 A1 * | 4/2020 | Notohardjono | ........ | H02B 1/303 |

OTHER PUBLICATIONS

"Impact Absorber Front 1999-2004", https://www.cjponyparts.com/impact-absorber-front-1999-2004/p/IA6/, Mustang Impact Absorber Front 1999-2004 | CJ Pony Parts, printed Jun. 15, 2018, pp. 1-3.
Belingardi et al., "Solid Mechanics and Its Applications", https://www.researchgate.net/publications/258517385_Solid_Mechanics_ . . . , Jan. 2013, pp. 1-39.
http://drexelfsaeimpact.blogspot.com/p/updates.html, "FSAE Impact Attenuator", printed Oct. 12, 2018, pp. 1-4.

* cited by examiner

US 11,070,037 B2

MULTI-DIRECTIONAL IMPACT PROTECTION WITH MAGNITUDE AND DIRECTION INDICATOR

FIELD OF THE INVENTION

This disclosure relates generally to shock impact protection, and in particular, to an apparatus for protecting electrical equipment from shock impact.

BACKGROUND OF THE INVENTION

A server computer typically includes a server frame for housing various electronic equipment configured to customer requirements. In addition to the various electronic equipment being susceptible to variations in temperatures, the various electronic equipment is sensitive to shock and physical damage resulting from impacts. Such impacts primarily occur during the transportation stage of a product delivery, when the server frame with the various electronic equipment is transported between a manufacturing facility and a customer site for installation. Though the sever frame and the various electronic equipment are typically designed to withstand a threshold level of impact (e.g., 0.75 m/s), there are various unforeseen circumstances that cause the server frame and the various electronic equipment to experience an impact greater than threshold level.

SUMMARY

One aspect of an embodiment of the present invention discloses an apparatus for protecting against a multi-directional impact, the apparatus comprising a body with a first set of radial segments, wherein the body is coupled to an object such that the first set of radial segments extend beyond a planar surface of the object. The apparatus further comprising a first radial segment of the first set of radial segments having a diameter greater than a second radial segment of the first set of radial segments. The apparatus further comprising a first notch of the first set of radial segments separating the first radial segment and the second radial segment having a concave edge, wherein the first radial segment and the second radial segment each extend beyond the concave edge of the first notch of the first set of radial segments.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1A:
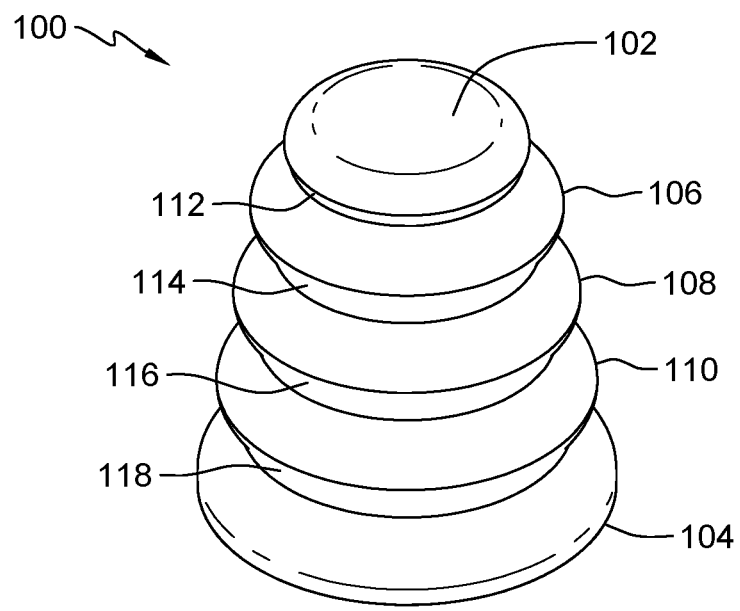
FIG. 1A depicts an isometric view of a crush cone structure, in accordance with an embodiment of the present invention.

Embodiments of the present invention provide an apparatus for a predictable collapsible structure, where the collapsible structure also serves as a visual indicator that an object (e.g., server frame) has experienced shock due to an impact. The predictable collapsible structure, also referred to as a crush structure, utilizes a combination of segments separated by notches to provide protection of the object to which the predictable collapsible structure is coupled. The predictable collapsible structure utilizes sequential deformation that indicates an impact direction and velocity level, since each segment of the predictable collapsible structure is designed to deform at a particular velocity level. Structural deformation of each segment of the predictable collapsible structure is designed to be consistent regardless of an angle of impact.

In one embodiment, the collapsible structure is corner mounted to a server frame, to provide multi-directional shock absorption from an impact to an edge of the server frame. In another embodiment, multiple collapsible structures are mounted to a bottom surface of a packaged server drawer to provide shock protection due to a gravity impact. A process for designing the collapsible structure includes tunable material thickness and properties for a given structure and weight application. The collapsible structure includes ascending stress concentration and cross section, from surface impact to protected member, that resists buckling and provides a sequential deformation.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FIG. 1A depicts an isometric view of a crush cone structure, in accordance with an embodiment of the present invention. In this embodiment, crush cone structure 100 includes impact circular structure 102 and mounting circular structure 104, where crush cone structure 100 is coupled to a surface of an object via a bottom surface of mounting circular structure 104 to protect the object from impacts experienced at a top surface of impact circular structure 104. When crush cone structure 100 is coupled to the object, crush cone structure 100 extends beyond a planar surface of the object to protect the surface of the object from any impacts. Circular structure 106, 108, and 110 form the body of crush cone structure 100, where each of circular structure 106, 108, and 110 provide a collapsible medium when an impact occurs at impact circular structure 102. Circular structure 106, 108, and 110 are also referred to as radial segments. A radius of circular structure 106 is greater than the radius of impact circular structure 102 but less than a radius of circular structure 108. The radius of circular structure 110 is greater than the radius of circular structure 108 but less than the radius of mounting circular structure 104. An amount of circular structures and a radius of each of the circular structures is dependent on impact absorption requirements of crush cone structure 100. Notch 112 separates impact circular structure 102 and circular structure 106, notch 114 separates circular structure 106 and circular structure 108, notch 116 separates circular structure 108 and circular structure 110, and notch 118 separates circular structure 110 and mounting circular structure 104. It is to be noted that both impact circular structure 102 and mounting circular structure 104 are collapsible when a force is applied to a top surface of impact circular structure 102.

In this embodiment, impact circular structure 102, mounting circular structure 104, circular structure 106, 108, and 110, each include a convex edge around the circumference. A radius of curvature of the convex edge for each of impact circular structure 102, mounting circular structure 104, circular structure 106, 108, and 110 is the same. In another embodiment, a radius of curvature of the convex edge for each of impact circular structure 102, mounting circular structure 104, circular structure 106, 108, and 110 increases as you move from impact circular structure 102 to mounting circular structure 104. Alternatively, a radius of curvature of the convex edge for each of impact circular structure 102, mounting circular structure 104, circular structure 106, 108, and 110 decreases as you move from impact circular structure 102 to mounting circular structure 104.

In this embodiment, notch 112, 114, 116, and 118 include a concave edge around the circumference medium between each of impact circular structure 102 and circular structure 106, circular structure 106 and circular structure 108, circular structure 108 and circular structure 110, and circular structure 110 and mounting circular structure 104, respectively. A radius of curvature of the concave edge of notch 112, 114, 116, and 118 is the same. In another embodiment, a radius of curvature of the concave edge of notch 112, 114, 116, and 118 increases as you move from impact circular structure 102 to mounting circular structure 104. Alternatively, a radius of curvature of the concave edge of notch 112, 114, 116, and 118 decreases as you move from impact circular structure 102 to mounting circular structure 104.

Figure 1B:
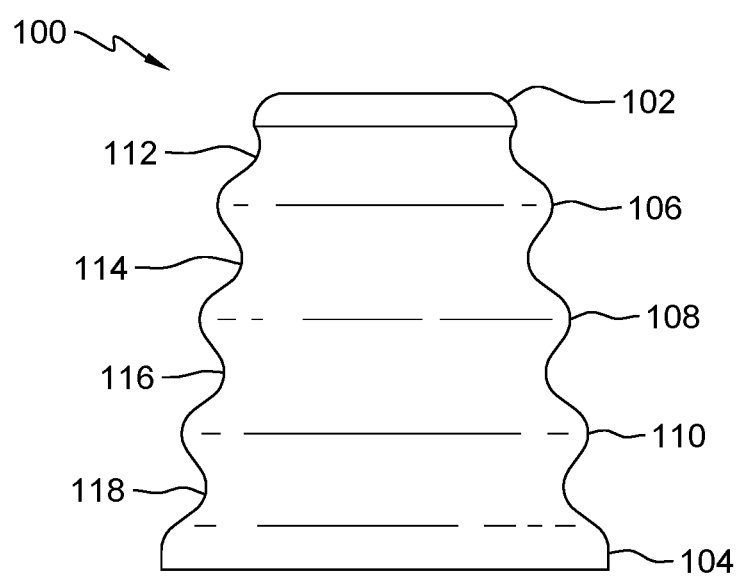
FIG. 1B depicts a side view of a crush cone structure, in accordance with an embodiment of the present invention.

FIG. 1B depicts a side view of a crush cone structure, in accordance with an embodiment of the present invention. A bottom surface of mounting circular structure 104 of crush cone structure 100 can be mounted to an object which is susceptible to damage due to shock resulting from an impact. Rather than the object taking a direct impact, a top surface of impact circular structure 102 bares the direct impact and energy from the direct impact is absorbed by the 5 levels of crush cone structure 100 that includes the combination of impact circular structure 102, mounting circular structure 104, and circular structures 106, 108, and 110. In this embodiment, the same radius for the concave edge of notches 112, 114, 116, and 118 is utilized when separating each of impact circular structure 102, mounting circular structure 103, and circular structures 106, 108, and 110. The deformation of crush cone structure 100 is consistent regardless of an angle of incidence experienced at impact circular structure 102.

As an initial impact occurs at impact circular structure 102 of crush cone structure 100, impact circular structure 102 absorbs the initial energy from the impact until the combination of impact circular structure 102 and notch 112 reaches a threshold of energy absorption and energy is transferred to circular structure 106. This cascading energy absorption occurs as the energy is transferred from impact circular structure 102 to mounting circular structure 104. As the energy from the impact cascades through impact circular structure 102, mounting circular structure 104, and circular structures 106, 108, and 110, there is a uniaxial sequential collapse that occurs through all 5 levels of crush cone structure 100.

Figure 2A:
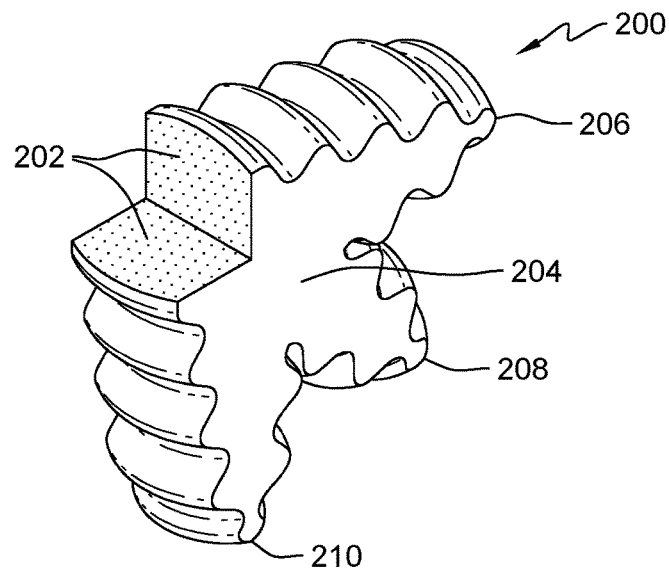
FIG. 2A depicts an isometric view of a 3 cone crush structure, in accordance with an embodiment of the present invention.

FIG. 2A depicts an isometric view of a 3 cone crush structure, in accordance with an embodiment of the present invention. In this embodiment, 3 cone crush structure 200 includes mounting surface 202 with body 204 from which cone structure 206, 208, and 210 protrude. Body 204 of 3 cone crush structure 200 utilizes a hollow design with mounting surface 202 and cone structure 206, 208, and 210 providing the exterior boundary surface. Cone structure 206 protrudes from body 204 at a 90 degree angle relative to cone structure 210. Cone structure 208 protrudes from body 204 at a 45 degree angle (i.e., acute angle) relative to both cone structure 206 and 210. In alternative embodiments, the angles between cone structure 206, 208, and 210 can vary to various degrees dependent on protection requirements of 3 cone crush structure 200. In one example, cone structure 206 can protrudes from body 204 at a 80 degree relative to cone structure 210, where cone structure 208 protrudes from body 204 at a 40 degree angle relative to both cone structure 206 and 210. In another example, cone structure 206 can protrudes from body 204 at a 100 degree angle (i.e., obtuse angle) relative to cone structure 210, where cone structure 208 protrudes from body 204 at a 60 degree angle relative to cone structure 206 and a 40 degree angle relative to cone structure 210.

Each of cone structure 206, 208, and 210 include partial radial segments, where each radial segment is separated by a notch. Similar to crush cone structure 100 from FIG. 1A-1B, each notch includes a concave edge and each of the partial radial segments include a convex edge. A radius of curvature for each of the concave edges of the notches are the same (e.g., R1) and a radius of curvature for each of the convex edges of the partial radial segments are the same (e.g., R2). In this embodiment, the radius of curvature for each of the concave edges (R1) is greater than the radius of curvature for each of the convex edges (R2).

Figure 2B:
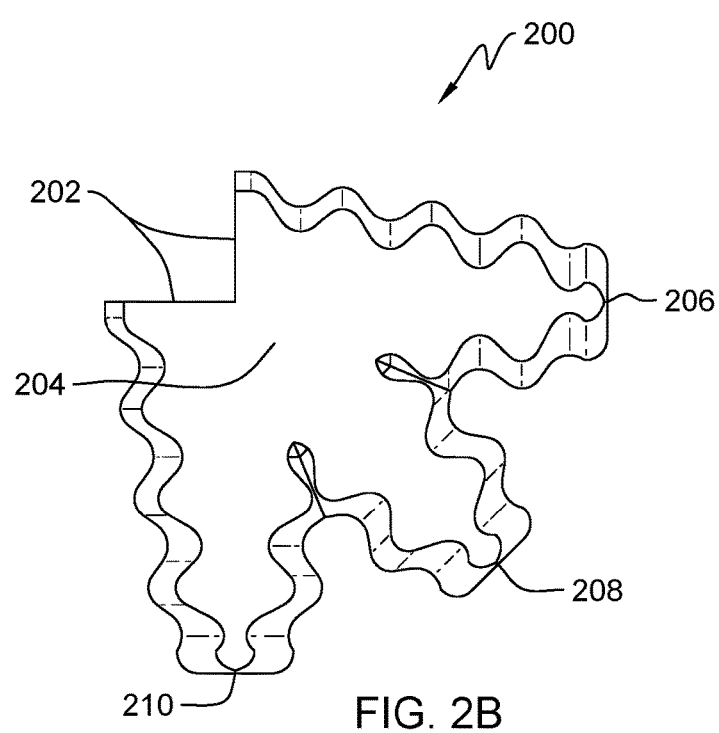
FIG. 2B depicts a top view of a 3 cone crush structure, in accordance with an embodiment of the present invention.

FIG. 2B depicts a top view of a 3 cone crush structure, in accordance with an embodiment of the present invention. In this embodiment, mounting surface 202 is at a 90 degree for coupling on a corner of object (e.g., server rack frame) to be protected from shock resulting from an impact and an angle of mounting surface 202 is dependent on the surface to which 3 cone crush structure 200 is being coupled to. Cone structure 206, 208, and 210 provide at least a 90 degree protection range since each of cone structure 206, 208, and 210 is capable of a consistent structural deformation regardless of an angle of incidence (i.e., impact). In addition to cone structure 206, 208, and 210, body 204 also provides energy absorption through structure deformation based on a severity of the impact, where there is a sequential collapse that occurs through all levels (i.e., partial radial segment and notch combination) of each of cone structure 206, 208, and 210. Each cone structure 206, 208, and 210 is similar in structure to crush cone structure 100 as discussed in FIG. 1A-1B. In other embodiments, 4 cone structures can protrude from body 204 to provide addition impact absorptions for a protection range that is greater than 90 degrees.

Figure 2C:
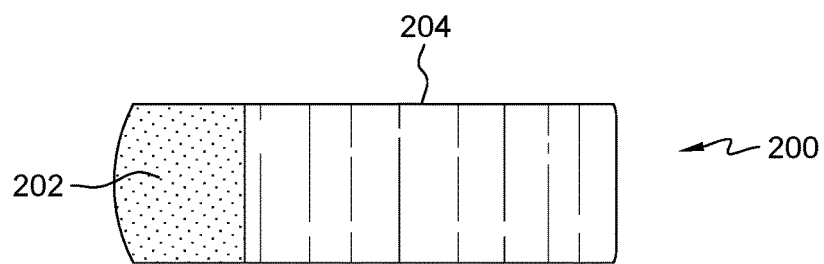
FIG. 2C depicts a side view of a 3 cone crush structure, in accordance with an embodiment of the present invention.

FIG. 2C depicts a side view of a 3 cone crush structure, in accordance with an embodiment of the present invention. An area of mounting surface 202 is dependent on being able to support body 204 of 3 cone crush structure 200, such that mounting surface 202 withstands the weight of body 204 and any force applied to body 204 while experiencing deformation due to an impact.

Figure 2D:
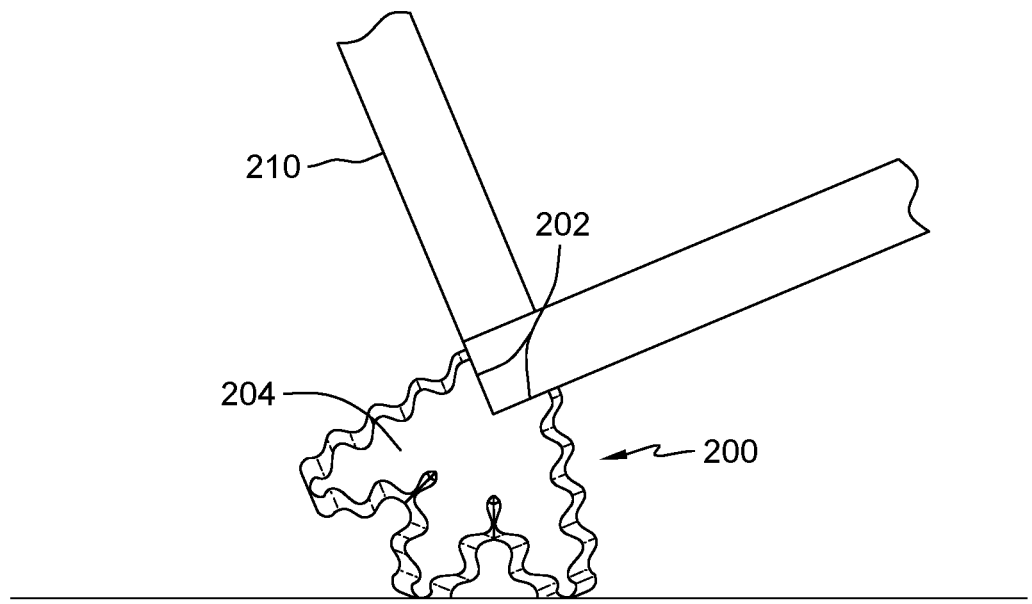
FIG. 2D depicts a top view of a 3 cone crush structure coupled to a server frame experiencing an initial impact, in accordance with an embodiment of the present invention.

FIG. 2D depicts a top view of a 3 cone crush structure coupled to a server frame experiencing an initial impact, in accordance with an embodiment of the present invention. 3 cone crush structure 200 is coupled to an edge of server rack frame 210 via mounting surface 202, where 3 cone crush structure 200 provides a 90 degree protection range for an impacts to the edge of sever rack frame 210. In this embodiment, server rack frame 210 is experiencing initial contact with a wall at an angle that is within the 90 degree protection range (i.e., 0<X<90) of 3 cone crush structure 200. Though not illustrated in FIG. 2D, server rack frame 210 is rectangular in shape and includes 3 cone crush structure 200 on each of the remaining 3 corners, where the combination of the four 3 cone crush structure 200 provide a 360 degree total protection range.

Figure 2E:
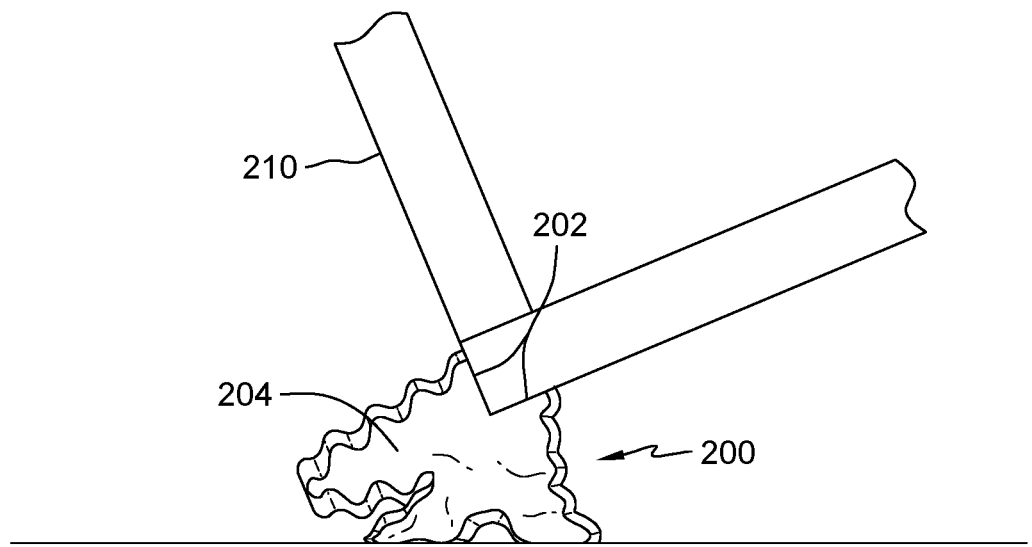
FIG. 2E depicts a top view of a 3 cone crush structure coupled to a server frame experiencing deformation due to an impact, in accordance with an embodiment of the present invention.

FIG. 2E depicts a top view of a 3 cone crush structure coupled to a server frame experiencing deformation due to an impact, in accordance with an embodiment of the present invention. In this embodiment, 3 cone crush structure 200 coupled to an edge of server rack frame 210 via mounting surface 202 has experienced deformation due to an impact with a wall. The impact experienced by 3 cone crush structure 200 allowed for deformation of 2 cone structures and partial deformation of body 204.

Figure 3A:
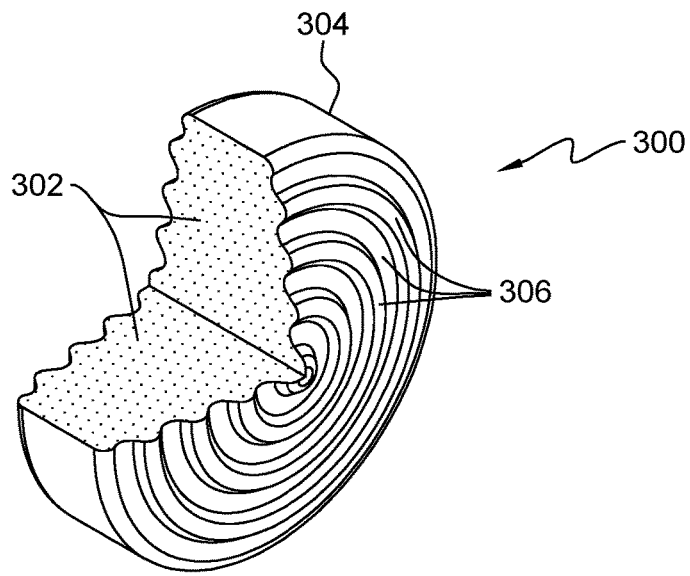
FIG. 3A depicts an isometric view of a continuous crush structure, in accordance with an embodiment of the present invention.

FIG. 3A depicts an isometric view of a continuous crush structure, in accordance with an embodiment of the present invention. In this embodiment, continuous crush structure 300 includes mounting area 302, impact surface 304, and crush section 306. Continuous crush structure 300 is a hollow design that couples to a surface of an object (e.g., server rack frame) via mounting area 302, where impact surface 304 provides the exterior boundary surface for protecting the object. Impact surface 304 represents the area of continuous crush structure 300 where an impact force is applied when an initial contact is made with a foreign object. Continuous crush structure 300 includes crush section 306 which includes multiple partial radial segments, where each radial segment is separated by a notch. Similar to crush cone structure 100 from FIG. 1A-1B, each notch includes a concave edge and each of the partial radial segments include a convex edge. A radius of curvature for each of the concave edges of the notches are the same (e.g., R1) and a radius of curvature for each of the convex edges of the partial radial segments are the same (e.g., R2). An amount of partial radial segments of crush sections 306 is dependent on the impact absorption requirement of continuous crush structure 300 for protecting the object to which continuous crush structure 300 is coupled.

Figure 3B:
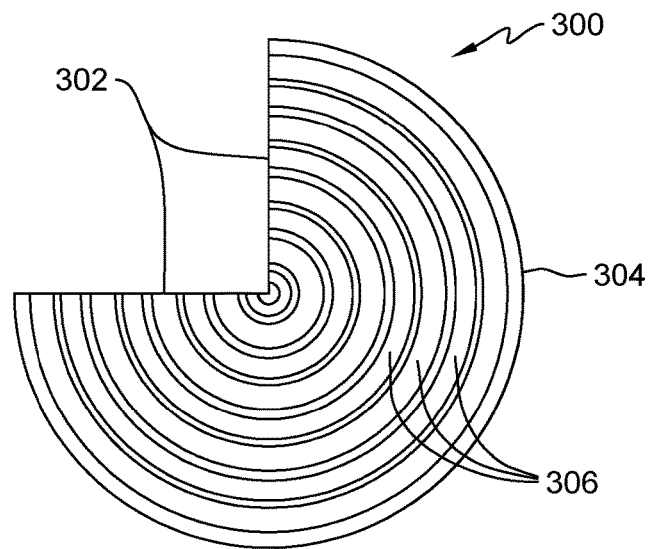
FIG. 3B depicts a top view of a continuous crush structure, in accordance with an embodiment of the present invention.

FIG. 3B depicts a top view of a continuous crush structure, in accordance with an embodiment of the present invention. In this embodiment, mounting area 302 is at a 90 degree angle for coupling on a corner of object (e.g., server rack frame) to be protected from shock resulting from an impact. An angle of mounting area 302 can vary (e.g., 50 degrees, 110 degrees) depending on an application of continuous crush structure 300. Continuous crush structure 300 provides a 270 degree protection range, where continuous crush structure 300 provides a varying level of protection for the corner of the object based on the impact location along impact surface 304. Crush section 306 includes five partial radial segments to provide a crushable body for absorption of impacts, where each pair of the five partial radial segments are separated by notches. The outer most partial radial segment of the five partial radial segments is impact surface 304 where an impact force is applied when an initial contact is made with a foreign object by continuous crush structure 300. An amount of partial radial segments and notches of continuous crush structure 300 is dependent on deformation and impact protection requirements for the object to which continuous crush structure 300 is coupled. Each combination of partial radial segments and notches of crush section 306 provides impact absorption through structure deformation based on a severity of the impact, where there is a sequential collapse that occurs through all levels (i.e., partial radial segment and notch combination) of continuous crush structure 300.

Figure 3C:
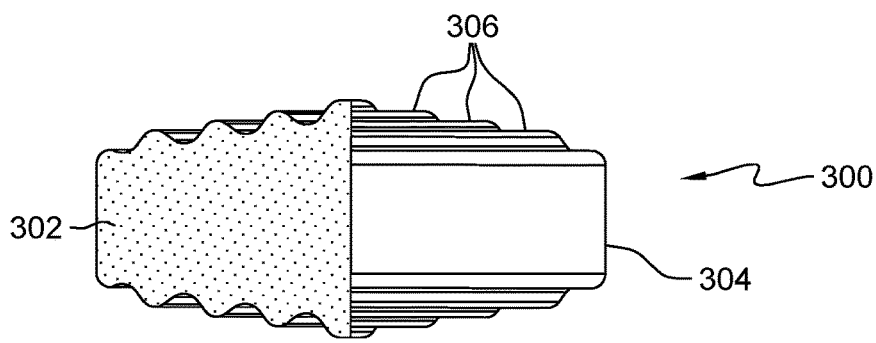
FIG. 3C depicts a side view of a continuous crush structure, in accordance with an embodiment of the present invention.

FIG. 3C depicts a side view of a continuous crush structure, in accordance with an embodiment of the present invention. The side view of continuous crush structure 300 provides a cross-sectional view at mounting area 302, where the five partial radial segments and notches of crush section 306 are illustrated. As previously mentioned, impact surface 304 represents the outer most partial radial segment of the five partial radial segments, where an impact force is applied when an initial contact is made with a foreign object by continuous crush structure 300.

Figure 3D:
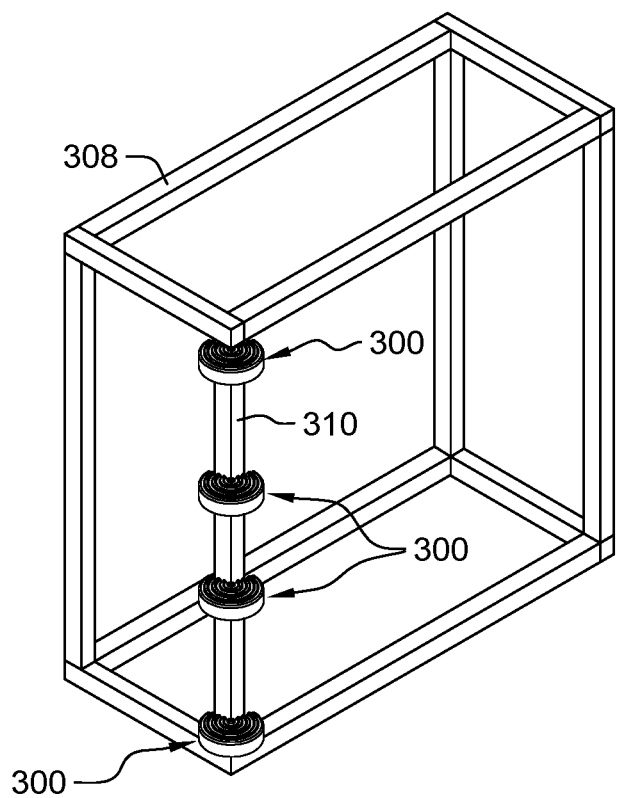
FIG. 3D depicts an isometric view of multiple continuous crush structures coupled to a server frame, in accordance with an embodiment of the present invention.

FIG. 3D depicts an isometric view of multiple continuous crush structures coupled to a server frame, in accordance with an embodiment of the present invention. In this example, multiple continuous crush structures 300 are horizontally coupled to vertical rail 310 of server frame 308, such that server frame 308 is protected from impacts encountered along a length of vertical rail 310. An amount of continuous crush structures 300 coupled to vertical rail 310 is dependent on impact absorption requirements for server frame 308, which accounts for a weight of server frame 308, a total weight of electronic equipment configured on server frame 308, and an estimated impact velocity that server frame 308 experiences during transport. Though not illustrated in FIG. 3D, server frame 308 can include multiple continuous crush structures 300 coupled to the three remaining vertical rails, for a total of 16 continuous crush structures 300 for protecting server frame 308 from impacts during transport. In other embodiments, continuous crush structure 300 is vertically mounted on a horizontal rail of server rack 308 to further protect the server frame 308 during transport. The protruding nature of continuous crush structure 300 not only protects the vertical and horizontal rails but also any protruding electronic equipment configured on server frame 308 that protrudes a distance less than continuous structure 300.

Figure 3E:
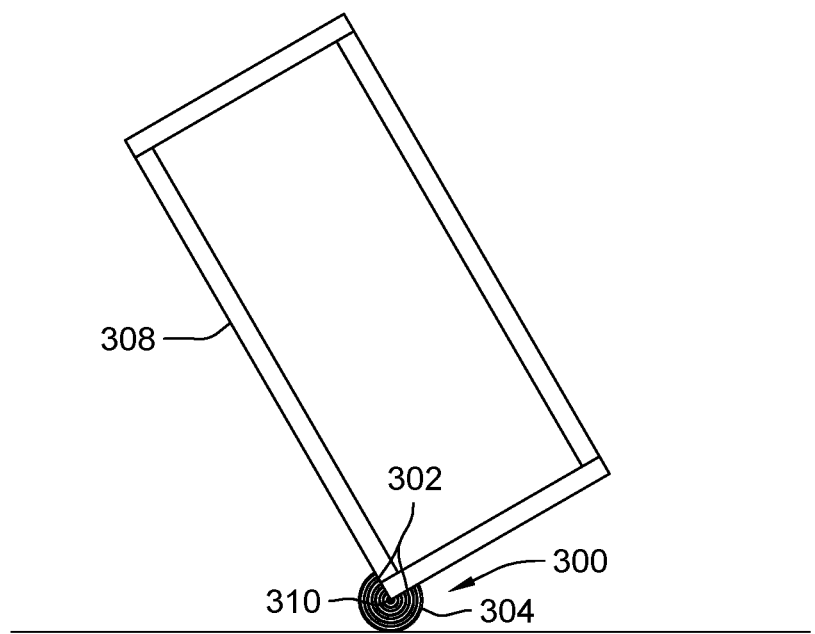
FIG. 3E depicts a top view of a continuous crush structures coupled to a server frame experiencing an initial impact, in accordance with an embodiment of the present invention.

FIG. 3E depicts a top view of a continuous crush structures coupled to a server frame experiencing an initial impact, in accordance with an embodiment of the present invention. In this embodiment, continuous crush structure 300 coupled to vertical rail 310 of server frame 308 via mounting area 302 is experiencing initial contact with a wall at an angle that is within a protection range of continuous crush structure 300. Impact surface 304 experiences the initial contact with the wall and any deformation resulting from the force of the impact is propagated through the partial radial segments and notches of continuous crush structure 300.

Figure 4A:
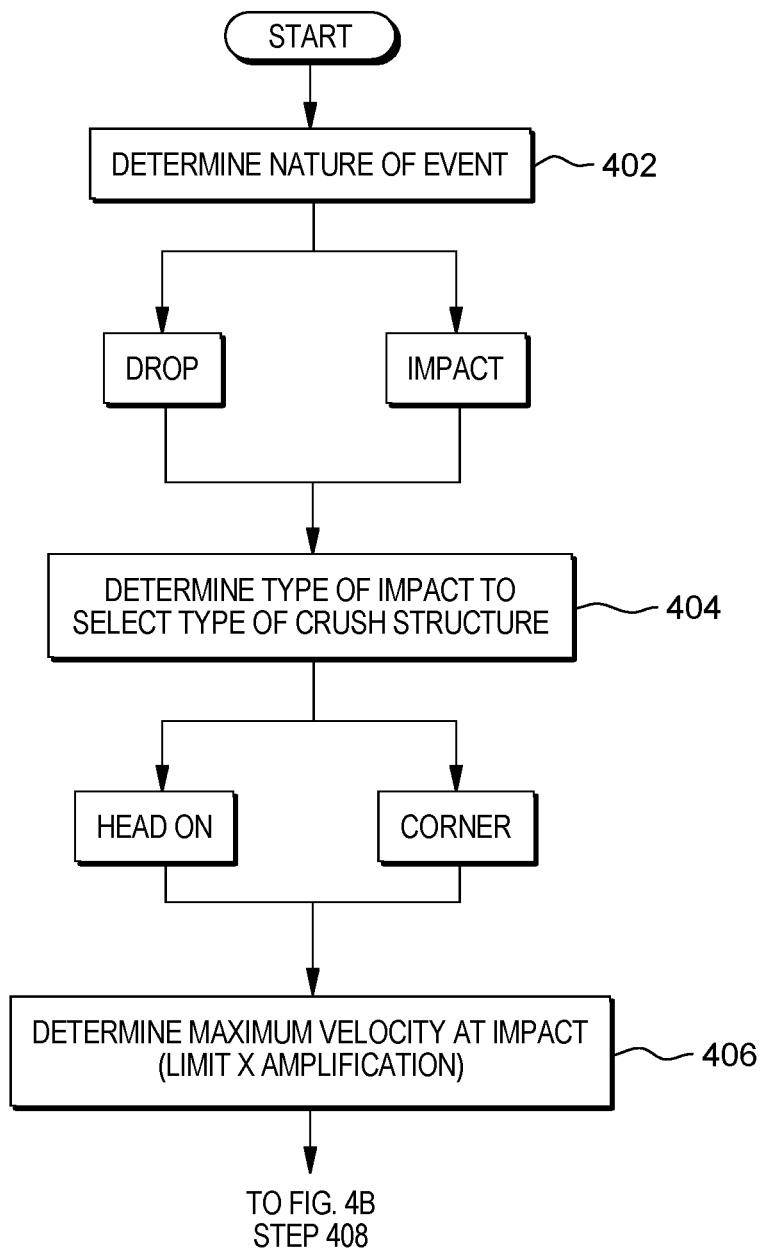
FIG. 4A is a flowchart for determining an impact type and magnitude, in accordance with one embodiment of the present invention.

FIG. 4A is a flowchart for determining an impact type and magnitude, in accordance with one embodiment of the present invention. Prior to selecting an optimal crush structure, a process includes determining a potential impact type and impact magnitude. The process includes determining (402) a nature of an event, which is categorized by a drop impact or an impact. A drop impact can include a packaged server component dropped from a low height by a package carrier, where gravity provides the force and velocity for any shock experienced by the packaged server component. An impact can include a server rack on a pallet pushed into a wall by an operator of a pallet jack, where gravity does not provide the force and velocity for the any shock experienced by the server rack. Upon determining the nature of the event, the process includes determining (404) a type of impact to select a type of crush structure, which is categorized by a head-on impact or corner impact. A head-on impact can include any planar surface of an object that experiences an impact or drop impact. A corner impact can include any edge surface of an object that experience an impact or drop impact. Upon determining the type of impact, the process includes determining (406) a maximum velocity at impact defined by limit X amplification.

Figure 4B:
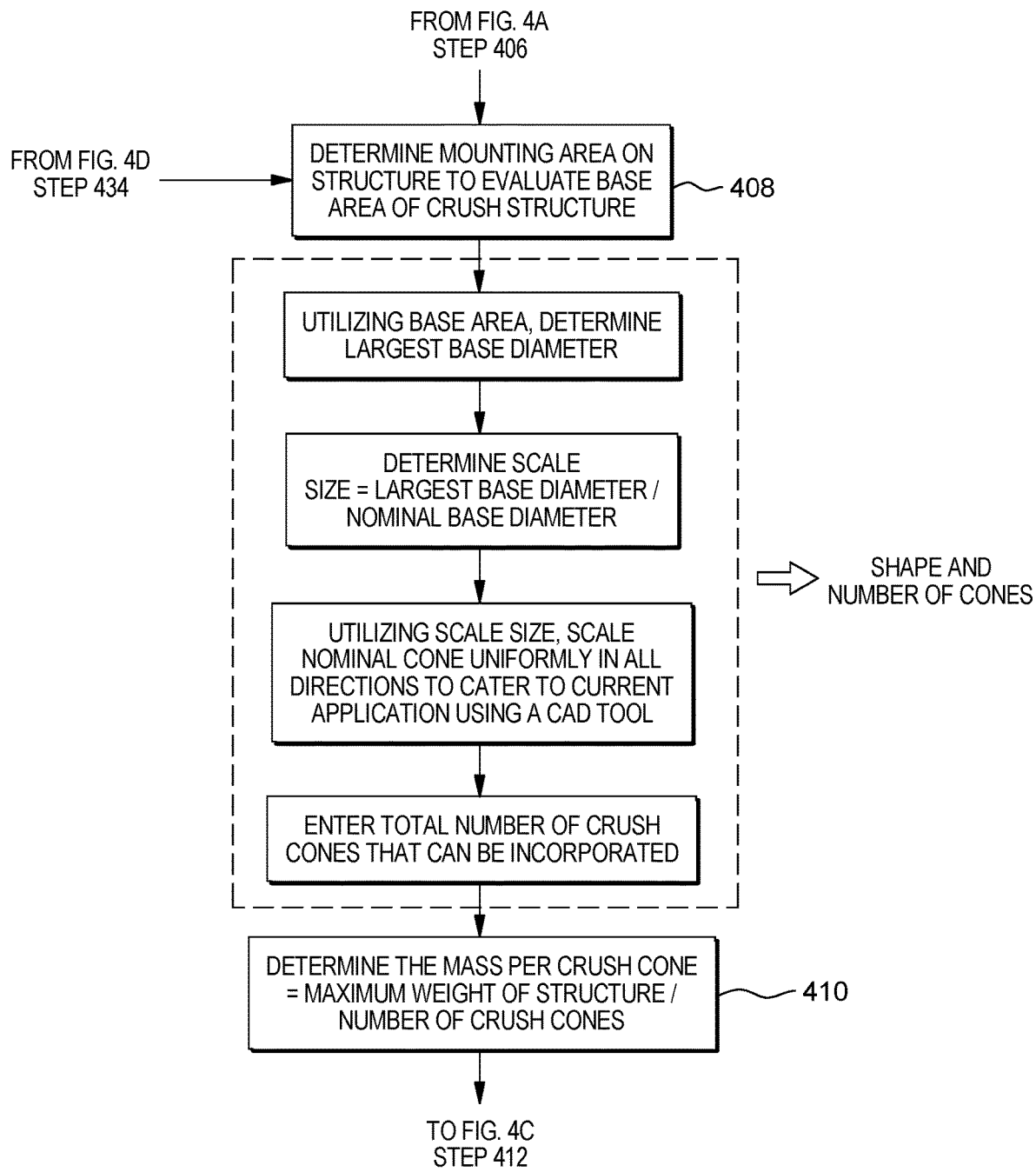
FIG. 4B is a flowchart for determining load and boundary conditions, in accordance with one embodiment of the present invention.

FIG. 4B is a flowchart for determining load and boundary conditions, in accordance with one embodiment of the present invention. Subsequent to determining of the potential impact type and impact magnitude, the process includes determining the load and boundary conditions. The process includes determining (408) a mounting area on the structure to evaluate a base area of a crush structure. The base area of a crush structure represents a first coupling surface and the mounting area on the structure represent a second coupling surface, where the first coupling surface joins with the second coupling surface when attaching the crush structure to the structure being protected. Utilizing the base area of the crush structured based on the mounting area on the structure, a largest possible base diameter is determined. A scale size is determined by utilizing a ratio of the largest possible base diameter to a nominal base diameter. Utilizing scale size, scale nominal cone uniformly in all directions to cater to current application utilizing a CAD tool, a total number of crush cones can be incorporated is entered. The process includes determining (410) the mass per crush cones as a ratio of maximum weight of structure to a number of crush cones.

Figure 4C:
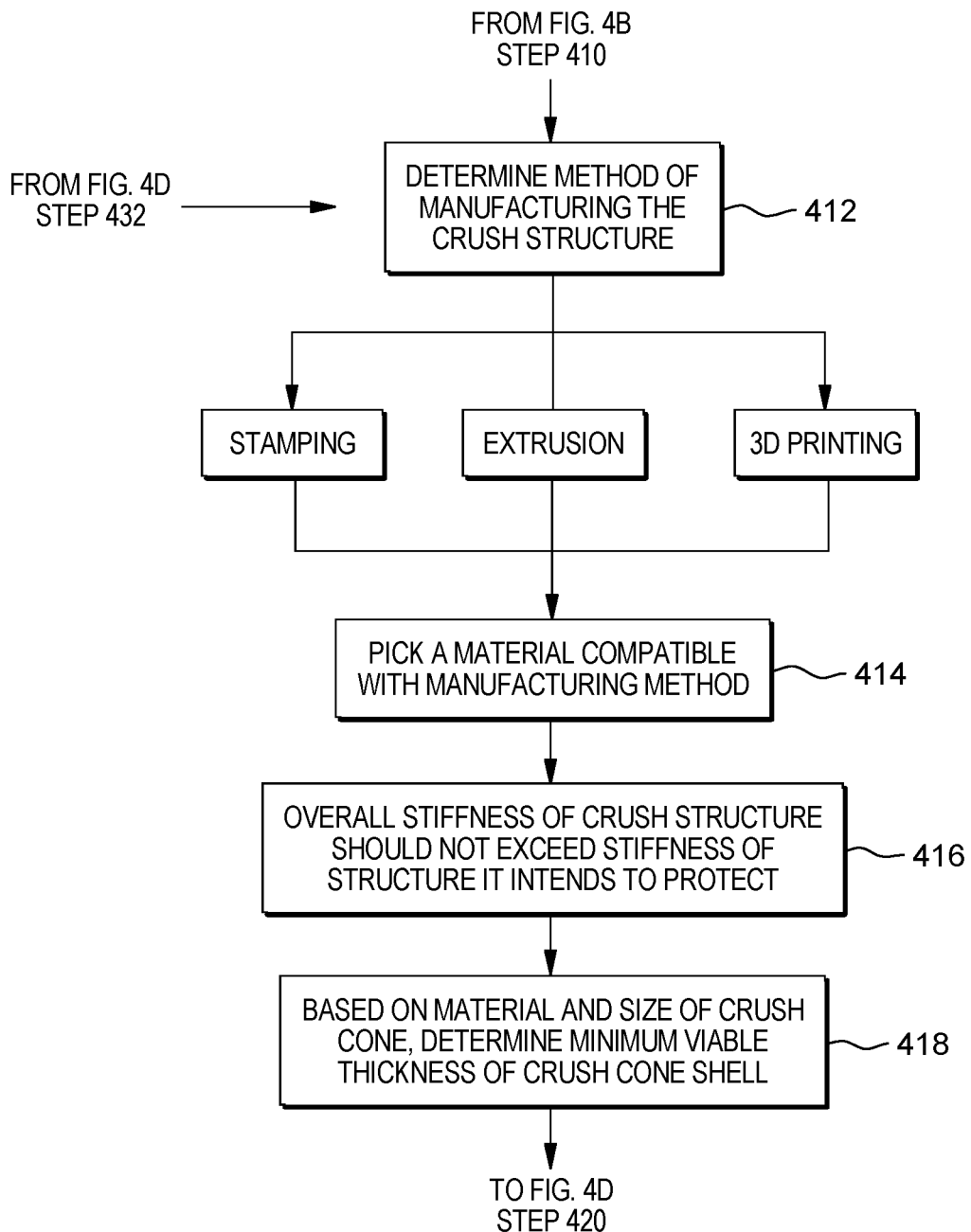
FIG. 4C is a flowchart for selecting material and thickness for a crush structure, in accordance with one embodiment of the present invention.

FIG. 4C is a flowchart for selecting material and thickness for a crush structure, in accordance with one embodiment of the present invention. Subsequent to determining the load and boundary conditions, the process includes selecting a manufacturing method, material, and thickness of the crush structure. The process includes determining (412) a method of manufacturing the crush structure, where the method of manufacturing includes but is not limited stamping, extrusion, and 3D printing. Subsequently, the process includes picking (414) a material compatible with the manufacturing method, where an overall stiffness of crush structure should not exceed stiffness of structure it intends to protect (416). Based on material and size of the crush cone, a determination (418) of minimum viable thickness of crush cone shell is performed.

Figure 4D:
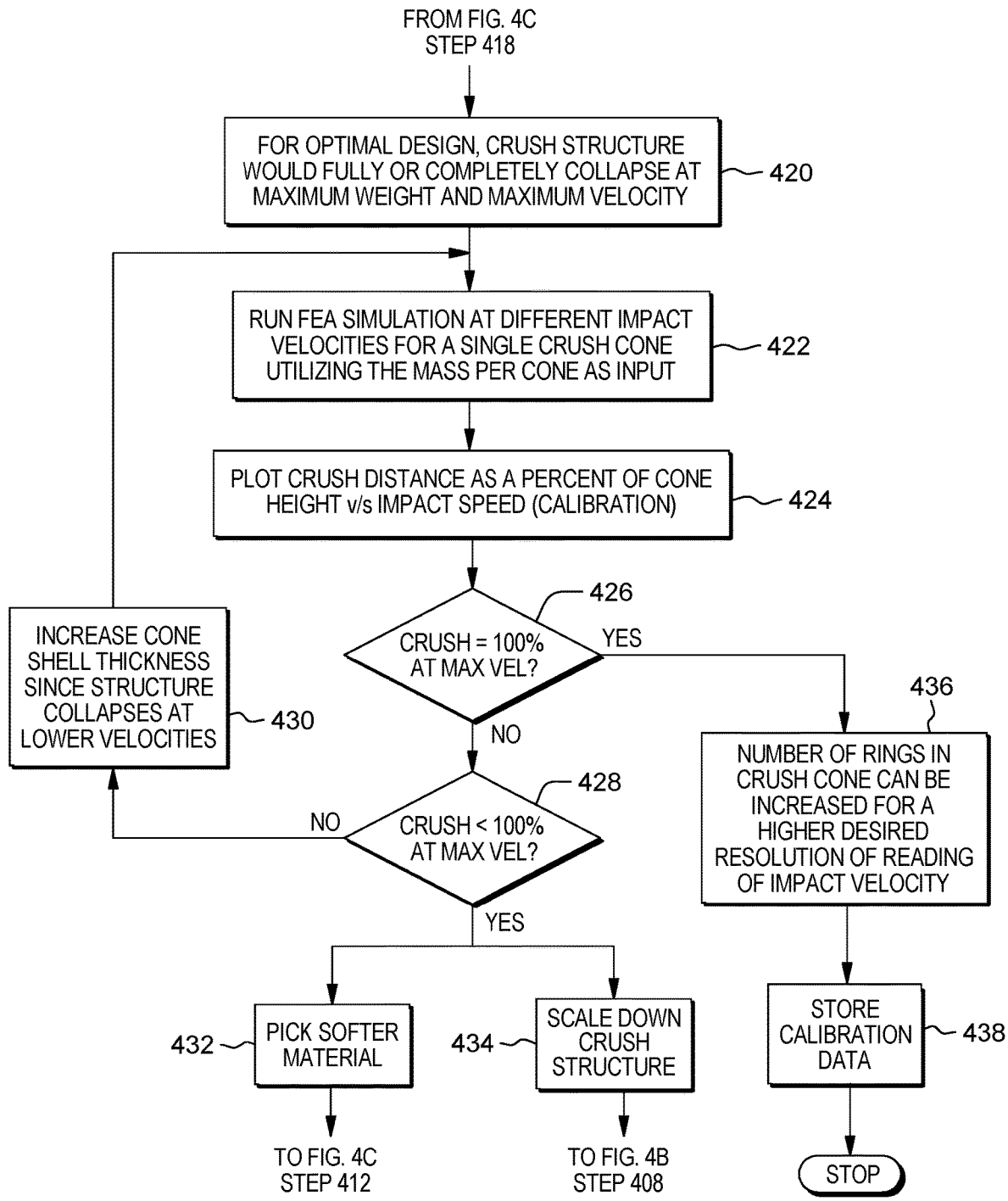
FIG. 4D is a flowchart for simulation and calibration of a crush structure, in accordance with one embodiment of the present invention.

FIG. 4D is a flowchart for simulation and calibration of a crush structure, in accordance with one embodiment of the present invention. For optimal design, the crush structure would fully or completely collapse at maximum weight and maximum velocity (420). The process includes running Finite Element Analysis (FEA) simulation at different impact velocities for a single crush cone utilizing the mass per cone as input (422) and plotting crush distance as a percent of cone height versus impact speed (424). Based on the FEA simulation, the process includes determining whether a 100% crush has occurred at max velocity (426). If 100% crush has not occurred at max velocity ("No" branch, 426), the process includes determining whether less than 100% crush has occurred at max velocity (428). If 100% crush has occurred at max velocity ("No" branch, 426), a number of rings in the crush cone can be increased for a higher demand resolution of reading impact velocity (436). The resolution procedure is discussed in further detail with regards to FIG. 4E. Subsequent to the resolution procedure for the crush structure, the calibration date is stored (438).

If more than 100% has occurred at max velocity ("No" branch, 428), the process includes increasing the cone shell thickness since the structure collapses at lower velocities (430). If less than 100% has occurred at max velocity ("yes" branch, 428), a softer material is picked (432) or the crush structure is scaled down (434). Upon selecting a softer material, the process reverts to determining a method of manufacturing the crush structure (412). Upon scaling down the crush structure, the process reverts to determining a mounting area on the structure to evaluate a base area of a crush structure (408).

Figure 4E:
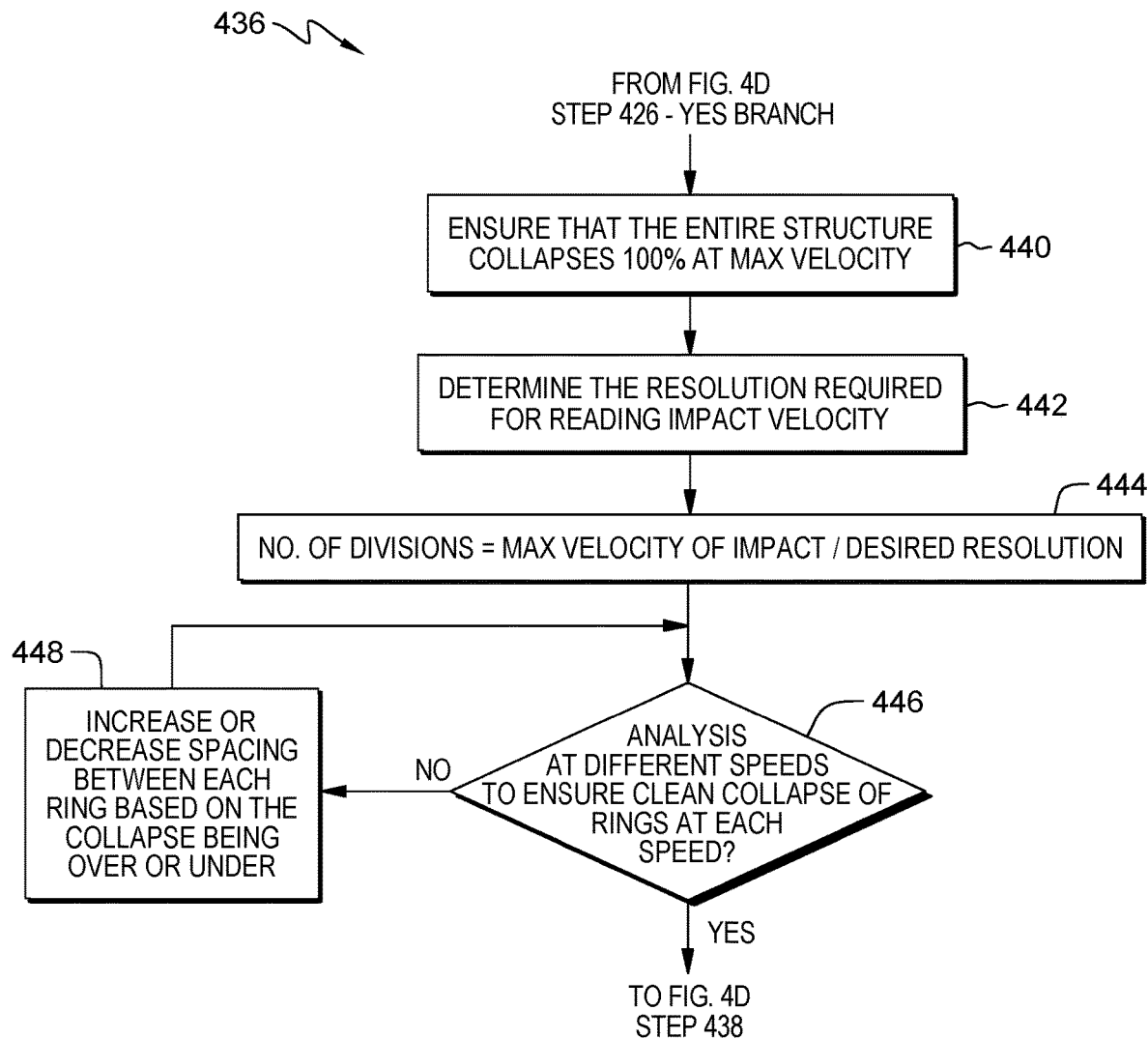
FIG. 4E is a flowchart for a resolution procedure when selecting a crush structure, in accordance with one embodiment of the present invention.

FIG. 4E is a flowchart for a resolution procedure when selecting a crush structure, in accordance with one embodiment of the present invention. The resolution procedure includes ensuring that the entire structure collapses 100% at max velocity (440) and determining the resolution required for reading impact velocity (442). A number of divisions of the crush structure is a ratio of max velocity of impact to desired resolution (444). The process further includes analysis at different speeds to ensure a clean collapse of the rings at each speed (446). If there is no clean collapse of the rings at each speed ("No" branch, 446), the process calls for an increase or decrease spacing between each ring based on the collapse being over or under (448). If there is a clean collapse of the rings at each speed ("Yes" branch, 446), the process calls for storing of the calibration data of the crush structure (438).

The terminology used herein is for the purpose of describing particular embodiments only and is not intended to be limiting to the invention. As used herein, the singular forms "a", "an" and "the" are intended to include the plural forms as well, unless the context clearly indicates otherwise.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. An apparatus comprising:
    a body with a first set of radial segments, wherein the body is coupled to a server rack frame such that the body is positioned on a first planar surface of a first rail of the server rack frame and a second planar surface of a second rail of the server rack frame adjacent to the first planar surface of the first rail of the server rack frame, wherein the first planar surface of the first rail of the server rack frame is oriented in a first plane, wherein the second planar surface of the second rail of the server rack frame is oriented in a second plane, wherein an angle of a mounting area of the body for coupling the body to the server rack frame equals an angle defined by the first plane and the second plane;
    a first radial segment of the first set of radial segments having a first radius greater than a second radius of a second radial segment of the first set of radial segments, wherein an impact force is applied to the first radial segment of the first set of radial segments when initial contact is made on an impact surface of the first radial segment providing an exterior boundary surface for the body; and
    a first notch of the first set of radial segments separating the first radial segment and the second radial segment and having a concave edge extending an angle equal to 360 degrees minus the angle defined by the first plane and the second plane,
        wherein the first radial segment and the second radial segment each extend beyond the concave edge of the first notch of the first set of radial segments,
        wherein a combination of the first radial segment, the second radial segment, and the first notch is configured to provide a sequential collapse of the first set of radial segments.

2. The apparatus of claim 1, wherein an angle of extension of the first set of radial segments is equal to 360 degrees minus the angle defined by the first plane and the second plane.

3. The apparatus of claim 1, wherein the body is hollow.

4. The apparatus of claim 1, wherein the first radial segment and the second radial segment each include a convex edge.

5. The apparatus of claim 4, wherein a radius of the convex edge of the first radial segment is equal to a radius of the convex edge of the second radial segment.

6. The apparatus of claim 1, further comprising:
    a third radial segment of the first set of radial segments having a third radius smaller than the second radius of the second radial segment of the first set of radial segments; and
    a second notch of the first set of radial segments separating the second radial segment and the third radial segment and having a concave edge, wherein the second radial segment and the third radial segment each extend beyond the concave edge of the second notch of the first set of radial segments.

7. The apparatus of claim 6, wherein a radius of the concave edge of the first notch of the first set of radial segments is equal to a radius of the concave edge of the second notch of the first set of radial segments.

8. The apparatus of claim 6, wherein a radius of the concave edge of the first notch of the first set of radial segments is less than a radius of the concave edge of the second notch of the first set of radial segments.

9. The apparatus of claim 6, wherein a radius of the concave edge of the first notch of the first set of radial segments is greater than a radius of the concave edge of the second notch of the first set of radial segments.

10. The apparatus of claim 6, wherein the third radial segment includes a convex edge.

* * * * *